United States Patent
Wideman et al.

(10) Patent No.: US 10,474,571 B2
(45) Date of Patent: Nov. 12, 2019

(54) GARBAGE COLLECTION AND DEFRAGMENTATION FOR SOLID STATE DRIVES (SSD) AND SHINGLED MAGNETIC RECORDING (SMR) DRIVES

(71) Applicant: Quantum Corporation, San Jose, CA (US)

(72) Inventors: Roderick B. Wideman, Shakopee, MN (US); Don Doemer, San Jose, CA (US)

(73) Assignee: Quantum Corporation, San Jose, CA (US)

( * ) Notice: Subject to any disclaimer, the term of this patent is extended or adjusted under 35 U.S.C. 154(b) by 179 days.

(21) Appl. No.: 15/618,723

(22) Filed: Jun. 9, 2017

(65) Prior Publication Data

US 2017/0277630 A1 Sep. 28, 2017

Related U.S. Application Data (62) Division of application No. 14/622,976, filed on Feb. 16, 2015, now Pat. No. 9,734,051.

(51) Int. Cl.
*H03M 13/00* (2006.01)
*G06F 12/02* (2006.01)
*H03M 13/37* (2006.01)

(52) U.S. Cl.
CPC ...... *G06F 12/0246* (2013.01); *H03M 13/373* (2013.01); *H03M 13/3761* (2013.01);
(Continued)

(58) Field of Classification Search
CPC ......... G06F 12/0246; G06F 2212/1044; G06F 2212/7205; G06F 2212/214; H03M 13/373; H03M 13/3761
See application file for complete search history.

(56) References Cited

U.S. PATENT DOCUMENTS

2012/0102297 A1 4/2012 Haines et al.
2013/0265669 A1* 10/2013 Hostetter ........... G11B 5/00813
360/60

(Continued)

OTHER PUBLICATIONS

Non-Final Office Action dated Jun. 10, 2016 for U.S. Appl. No. 14/622,976.

(Continued)

*Primary Examiner* — Samir W Rizk
(74) *Attorney, Agent, or Firm* — Eschweiler & Potashnik, LLC (57) ABSTRACT

Example apparatus and methods provide improved reclamation, garbage collection (GC) and defragmentation (defrag) for data storage devices including solid state drives (SSD) or shingled magnetic recording (SMR) drives. An erasure code (EC) layer that facilitates logically or physically erasing data from the SSD or SMR as a comprehensive GC or defrag is added to the SSD or SMR. Erased data may be selectively recreated from the EC layer as needed. Pre-planned EC write zones may be established to further optimize GC and defrag. Recreated data may be written to selected locations to further optimize SSD and SMR performance. Erasure code data may be distributed to co-operating devices to further improve GC or defrag. Example apparatus and methods may also facilitate writing data to an SMR drive using tape or VTL applications or processes and providing a pseudo virtual tape library on the SMR drive.

13 Claims, 10 Drawing Sheets

(52) U.S. Cl.
CPC .............. *G06F 2212/1044* (2013.01); *G06F 2212/214* (2013.01); *G06F 2212/7205* (2013.01); *Y02D 10/13* (2018.01)

(56) References Cited

U.S. PATENT DOCUMENTS

| | | | |
|---|---|---|---|
| 2014/0055881 A1* | 2/2014 | Zaharris | G11B 5/012 360/55 |
| 2015/0220392 A1 | 8/2015 | Jin et al. | |
| 2015/0363456 A1* | 12/2015 | Raman | G06F 16/2365 707/693 |

OTHER PUBLICATIONS

Non-Final Office Action dated Oct. 7, 2016 for U.S. Appl. No. 14/622,976.
Final Office Action dated Feb. 15, 2017 for U.S. Appl. No. 14/622,976.
Notice of Allowance dated Apr. 17, 2017 for U.S. Appl. No. 14/622,976.

* cited by examiner

GARBAGE COLLECTION AND DEFRAGMENTATION FOR SOLID STATE DRIVES (SSD) AND SHINGLED MAGNETIC RECORDING (SMR) DRIVES

REFERENCE TO RELATED APPLICATION

This Application is a Divisional of U.S. application Ser. No. 14/622,976 filed on Feb. 16, 2015, the contents of which are hereby incorporated by reference in their entirety.

BACKGROUND

Reading and writing from conventional tapes and disk drives involves mechanical motion of a read/write head(s) and/or media. Reading and writing from a solid state drive (SSD) does not involve mechanical motion. However, garbage collection and defragmentation of SSDs may be performed using techniques based on conventional tape and disk drive approaches that accounted for the mechanical movement of the read/write head. Thus, garbage collection and defragmentation of SSDs may produce inefficient bottlenecks that consume unnecessary, inappropriate or undesirable amounts of time, processor cycles, and energy.

An SSD, which may also be referred to as a solid-state disk, is a data storage device that uses integrated circuits as memory to store data. An SSD may have no moving parts (e.g., read/write heads), which distinguishes an SSD from a conventional spinning disk drive. An SSD may use NAND-based flash memory that retains data without power.

A shingled magnetic recording (SMR) drive is a drive that employs shingled magnetic recording to improve capacity on a hard disk drive magnetic storage. A conventional hard disk drive writes data in non-overlapping magnetic tracks that run parallel to each other. SMR drives write data in tracks that overlap part of a previously written magnetic track. The overwriting may leave the previous track thinner than it was before being partially overwritten, which may in turn increase track density. While overlapping tracks may increase density, writing data so that it partially overlaps a previously written track may be slower and may require some tracks to be rewritten. Garbage collection and defragmentation of SMR drives may be performed using techniques based on conventional disk drive approaches. Thus, garbage collection and defragmentation of SMR drives may also produce inefficient bottlenecks that consume unnecessary, inappropriate or undesirable amounts of time, processor cycles, and energy.

A user or organization may have a large number of tapes. The tapes may be actual tapes or may be virtual tapes stored in a virtual tape library. The user or organization may wish to back up or transport that large number of tapes. Conventionally, backing up or transporting a large number of tapes would require accessing a sufficient number of physical tapes for the backup or transport. When disk based technology was used to back up a tape, the conventional disk based approach may not have been able to aggregate and then control the location to which data for one tape was written.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Conventional data storage systems may perform reclamation, garbage collection (GC) and defragmentation (defrag) using techniques that copy data from location to location on a solid state drive (SSD) or shingled magnetic recording (SMR) drive. Example apparatus and methods may perform GC and defrag for SSD and SMR drives using a different approach that does not involve copying data from location to location. Example apparatus and methods may also perform zone reclamation based, for example, on monitoring the amount of active data in a zone. When the zone falls below a threshold, then the zone may simply be returned to an "available to overwrite" pool without copying the remaining residual data. Not having to copy data to perform reclamation, GC, or defrag creates the technical effect of improving the operation of a computer, particularly the performance of the SSD or SMR. Not having to copy data to perform reclamation, GC or defrag also reduces the energy required to operate an SSD or SMR. Thus, example apparatus and methods improve both the operational efficiency and energy efficiency of data storage apparatus and computers that interact with the data storage apparatus. The example apparatus and methods may perform the improved reclamation, GC or defrag when the data to be overwritten can be recreated from another source, for example, from erasure codes (EC) or parity.

Example apparatus and methods improve the efficiency of devices including SSD or SMR drives. In one embodiment, when data (e.g., EC) is available from which data in an area can be recreated without accessing the area itself, then the area may be allowed to be overwritten when, for example, the amount of active data in an area falls below a threshold. Active data that is overwritten may be recreated from the remaining data (e.g., EC, parity). This approach facilitates avoiding a read-modify-write of a zone on an SMR drive. EC may store data across zones, or even across SMR drives, so that when a zone fills, but then starts to have inactive (e.g., deleted, unused) pieces of data, the zone can be returned to a free pool to be overwritten from the beginning without having to perform defragmentation or garbage collection on that zone. There is no need to read and store residual active data for a zone that's going to be overwritten because the residual active data can be recreated from other data (e.g., EC, parity). In one embodiment, the residual active data can be rebuilt opportunistically using, for example, a background task. In one embodiment, the residual active data may only be rebuilt upon detecting a read of the residual active data.

Example apparatus and methods provide improved GC and defrag for data storage devices including SSD or SMR drives. Erasure code (EC) protection is provided for the data storage device. The EC protection facilitates simply erasing or over-writing data from the data storage device (e.g., SSD, SMR) as a fast and comprehensive GC or defrag. The data storage device may use pre-planned EC write zones to separate EC data from erasable data to further optimize GC and defrag. For example, the EC write zones may store no regular data that is subject to deletion by the improved GC or defrag.

Much data that is saved is never used. Thus, rather than automatically recreating all the data that was deleted during the comprehensive GC or defrag, erased data may be selectively recreated from the EC data as needed using, for example, a fixed generator matrix. Data that is never needed may never be recreated. Data that is needed may be recreated on an as-needed basis. Recreated data may be written to selected locations of a data storage device to further optimize GC or defrag performance for devices including SSD and SMR drives. Recreated data may be written in patterns that facilitate subsequent ubiquitous erasing. EC data may be distributed to co-operating devices to separate EC data from erasable data to further improve GC or defrag.

An erasure code is a forward error correction (FEC) code for the binary erasure channel. The FEC facilitates transforming a message of k symbols into a longer message with n symbols such that the original message can be recovered from a subset of the n symbols, k and n being integers, n>k. The original message may be, for example, a file. The fraction r=k/n is called the code rate, and the fraction k'/k, where k' denotes the number of symbols required for recovery, is called the reception efficiency. Optimal erasure codes have the property that any k out of the n code word symbols are sufficient to recover the original message. Optimal codes may require extensive memory usage, CPU time, or other resources when n is large.

Erasure codes are described in coding theory. Coding theory is the study of the properties of codes and their fitness for a certain purpose (e.g., backing up files). Codes may be used for applications including, for example, data compression, cryptography, error-correction, and network coding. Coding theory involves data compression, which may also be referred to as source coding, and error correction, which may also be referred to as channel coding. Fountain codes are one type of erasure code.

Fountain codes have the property that a potentially limitless sequence of encoding symbols may be generated from a given set of source symbols in a manner that supports ideally recovering the original source symbols from any subset of the encoding symbols having a size equal to or larger than the number of source symbols. A fountain code may be optimal if the original k source symbols can be recovered from any k encoding symbols, k being an integer. Fountain codes may have efficient encoding and decoding algorithms that support recovering the original k source symbols from any k' of the encoding symbols with high probability, where k' is just slightly larger than k. A rateless erasure code is distinguished from an erasure code that exhibits a fixed code rate.

As described above, a user or organization may have a large number of tapes that they want to back up or transport. Conventionally, the user would need to access a sufficiently large number of physical tapes and copy the data from an existing tape to a tape to be transported. Example apparatus and methods facilitate taking a different approach that produces a pseudo virtual tape library on an SMR drive. In one embodiment, an SMR drive facilitates producing overlapping tracks of data. Data from a tape may be written to a contiguous set of tracks. When a complete backup of data on a tape is completed to the set of tracks, then the physical grouping may be completed and a virtual tape exists on the SMR. Data from a next tape may then be written to a next contiguous set of tracks. When the next tape is completely backed up to the next contiguous set of tracks, then the next physical grouping may be completed and a next virtual tape may exist on the SMR. Additional tapes may be backed up similarly in subsequent contiguous sets of tracks. The process may be repeated until an entire set of tapes has been backed up to the SMR drive. In another embodiment, an SMR drive may be formatted with different zones or nodes. Individual tapes may be written to individual zones or nodes. When all desired tapes have been backed up, then the single SMR drive may be transported instead of transporting a number of tapes. The single SMR drive may be viewed as a virtual tape library. Transporting a single SMR drive that stores data for several tapes may be more efficient than transporting a plurality of physical tapes.

More generally, an organization may have software or processes that are familiar with writing data to tape. An SMR drive may "write like a tape" but "read like a disk." Thus, rather than having to rewrite all the software that is being used to interact with tape drives or non-SMR drives, example apparatus and methods facilitate using tape (e.g., virtual tape library (VTL)) software or processes to interact with an SMR.

SMR drives may perform more optimally when they are written sequentially. More optimal performance may achieved by avoiding rewrites and random accesses. SMR drives may also perform more optimally when sequential writes can begin at the beginning of a zone to avoid a costly repositioning, reading, or rewriting. Conceptually, example apparatus and methods facilitate presenting an SMR drive as a virtual tape drive. In one embodiment, an SMR drive may be manufactured with an integrated processor and memory that provide a tape or VTL interface to the SMR drive. Applications, users, and storage systems may interact with the SMR using existing VTL software, processes, and approaches. In one embodiment, a zone on an SMR may be treated as a single tape in a VTL. In this embodiment, a collection of zones on an SMR may be treated as a collection of virtual tapes in a VTL.

Some portions of the detailed descriptions herein are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is to be appreciated that throughout the description, terms including processing, computing, and determining refer to actions and processes of a computer system, logic, processor, or similar electronic device that manipulates and transforms data represented as physical (electronic) quantities.

Example methods may be better appreciated with reference to flow diagrams. For purposes of simplicity of explanation, the illustrated methodologies are shown and described as a series of blocks. However, it is to be appreciated that the methodologies are not limited by the order of the blocks, as some blocks can occur in different orders or concurrently with other blocks from that shown and described. Moreover, less than all the illustrated blocks may be required to implement an example methodology. Blocks may be combined or separated into multiple components. Furthermore, additional or alternative methodologies can employ additional, not illustrated blocks.

Figure 1:
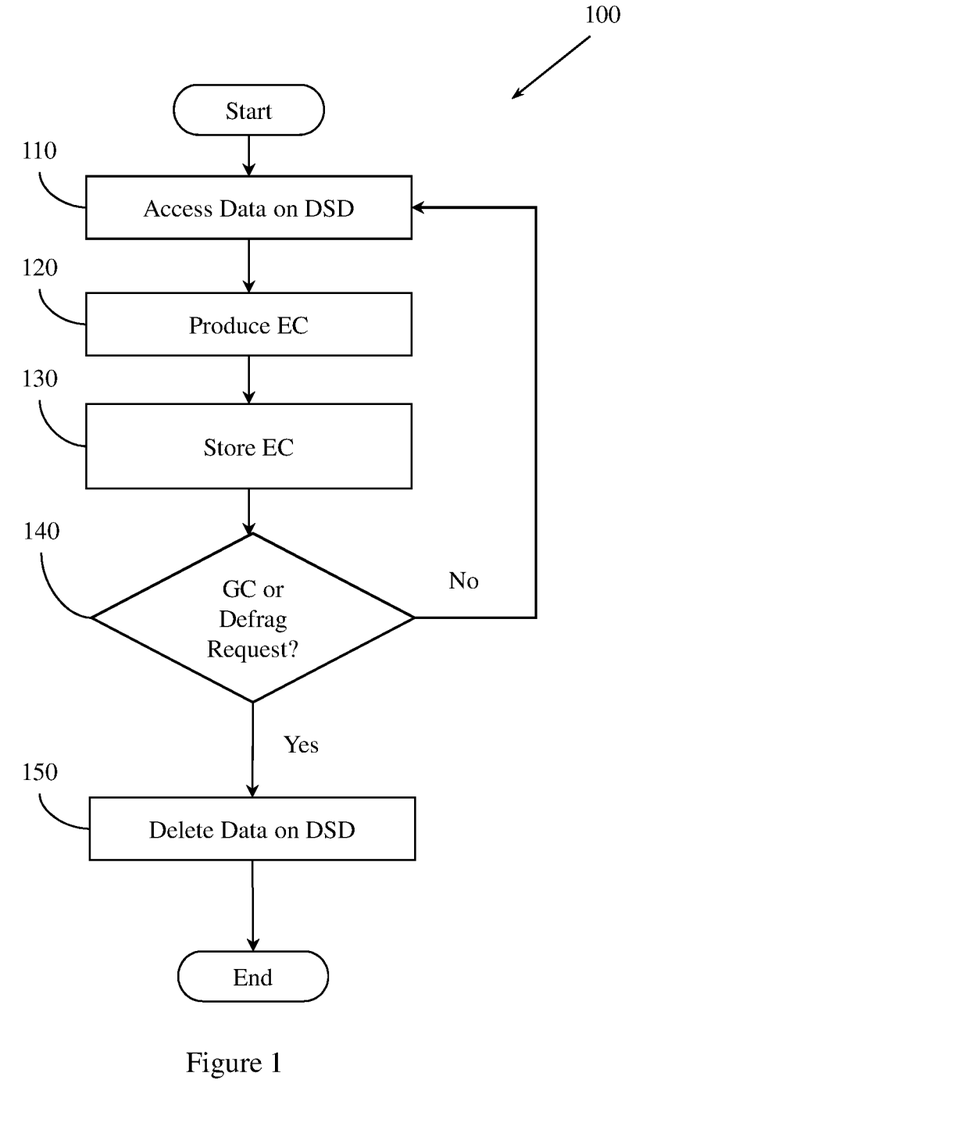
FIG. 1 illustrates an example method associated with improved reclamation, garbage collection (GC) or defragmentation (defrag) for data storage devices (DSD) including solid state drives (SSD) and shingled magnetic recording (SMR) drives.

FIG. 1 illustrates an example method 100 associated with improved reclamation, garbage collection (GC) and defragmentation (defrag) for data storage devices including solid state drives (SSD) and shingled magnetic recording (SMR) drives. Method 100 includes, at 110, accessing data stored on a data storage device (DSD). The DSD may be, for example, an SSD or an SMR drive. Accessing the data may include receiving a pointer to the data, receiving a map of used locations on the DSD, receiving a record that identifies locations that hold valid data on the DSD, or other computer-based action.

Method 100 also includes, at 120, producing or accessing erasure code data for the data. The erasure code data produced at 120 will be sufficient to recreate the data, which makes it possible to simply delete the data on the DSD in response to a reclamation, GC or defrag event or request rather than copying it from place to place as is done in conventional systems. Different types of erasure codes including, for example, Fountain Codes may be produced. In one embodiment, the reclamation may be requested upon determining that an amount of active data in an area (e.g., zone) on a device has fallen below a threshold. Thus, a reclamation may differ from a GC or defrag in that a reclamation may be an ongoing event-driven process that monitors the amount of active data in an area, region, zone, page, or other collection and that automatically reclaims the area, region, zone, etc. upon determining that the amount of active data has fallen below a threshold. No specific GC or defrag request may be necessary. While GC or defrag may be a more global type operation, ongoing reclamation may prevent the need to ever run a GC or defrag process.

Method 100 also includes, at 130, storing the erasure code data. In one embodiment, storing the erasure code data includes writing the erasure code data to a device separate from the DSD. For example, an SSD may be paired with a hard disk drive upon which erasure code data is stored. In another embodiment, storing the erasure code data includes replicating a portion of the erasure code data to two or more different locations. For example, an SMR may be associated with two SSDs that each store copies of the erasure code data. In one embodiment, the erasure code data may be spread among a large number (e.g., 16) of devices.

Method 100 also includes, upon receiving a reclamation, garbage collection or defragmentation request concerning the DSD at 140, selectively deleting a portion of the data on the DSD at 150. In different embodiments, deleting the portion of the data may include deleting all of the data on the DSD or less than all of the data on the DSD. While deleting the portion is described, in one embodiment the deletion may be virtual in that no data is actually removed or deleted. Instead, the deleting may include simply returning an area in which the portion is found to a pool of areas that are available to be overwritten. For example, a zone in an SMR may be returned to a free zone pool or a page in an SSD may be returned to a free page pool. While the residual data may still reside in the zone or page, that data has been logically deleted and will eventually be overwritten when the zone or page is reallocated and rewritten.

In method 100, the deleting is done without copying the portion of the data. Conventional systems and methods copy data from one location on a disk to another location on a disk as part of GC or defrag. Thus, there may be two copies of the data during the GC or defrag operation, the original copy in its original location and then the destination copy at the destination location. In a conventional system, the original copy may only be deleted after the write at the destination location is completed. These conventional approaches perform at least a read, a write, and then a delete for each unit (e.g., page, block) of data relocated. Example apparatus and methods simply delete, either logically or physically, the data because it can be recreated using the erasure codes. Simply deleting the data improves the operation of the reclamation, GC or defrag operation significantly and produces the technical effect of saving time and energy consumed by the DSD. Less time and energy are consumed because fewer operations are performed.

In one embodiment, deleting the portion of the data on the DSD is performed collectively, in bulk, in response to a single command to the DSD. Deleting data collectively, in bulk means deleting all the data that is to be deleted at once rather than one piece at a time. This may be performed in response to a single delete command rather than in response to a series of delete commands that are issued in conventional systems after a relocated unit has been written. An SSD may have a "delete all" function built in that allows all pages to be deleted simultaneously which is much faster than deleting pages selectively as they become available for deletion. An SMR drive may have a "delete all" function built in that allows all tracks to be overwritten sequentially, which is much faster than being overwritten randomly as they become available. Thus, method 100 improves the efficiency of any computer interacting with the improved DSD.

In one embodiment, when both the original data and the EC are stored, storing the erasure code data includes writing a portion of the erasure code data to a location on the DSD that is independent of the data. Being independent of the data means that the erasure code data is in a location whose contents will not be deleted by the collective, in bulk deletion of data on the DSD. For example, an SSD may have X blocks that each have Y pages of memory. The SSD may have Z blocks reserved for storing erasure code data, X, Y, and Z being numbers. The SSD may also have a command to delete the X-Z blocks that store non-erasure code data all at once in response to a single command. Similarly, an SMR may have A tracks, B of which are reserved for storing erasure code data, A and B being numbers. The SMR may also have a command to delete the A-B tracks that store non-erasure code data all at once in response to a single command. Deleting the data may be a physical action or a logical action. A physical delete would actually change the contents of the deleted locations. A logical delete may leave the contents intact but may mark a map of the locations to show that the location does not store any data and is available to receive writes. A subsequent write would overwrite the data at the location and the map would be updated after the overwrite. Thus, unlike a conventional system where data is copied from place to place during reclamation, GC or defrag, method 100 does not require a read, write, and then delete action.

Figure 2:
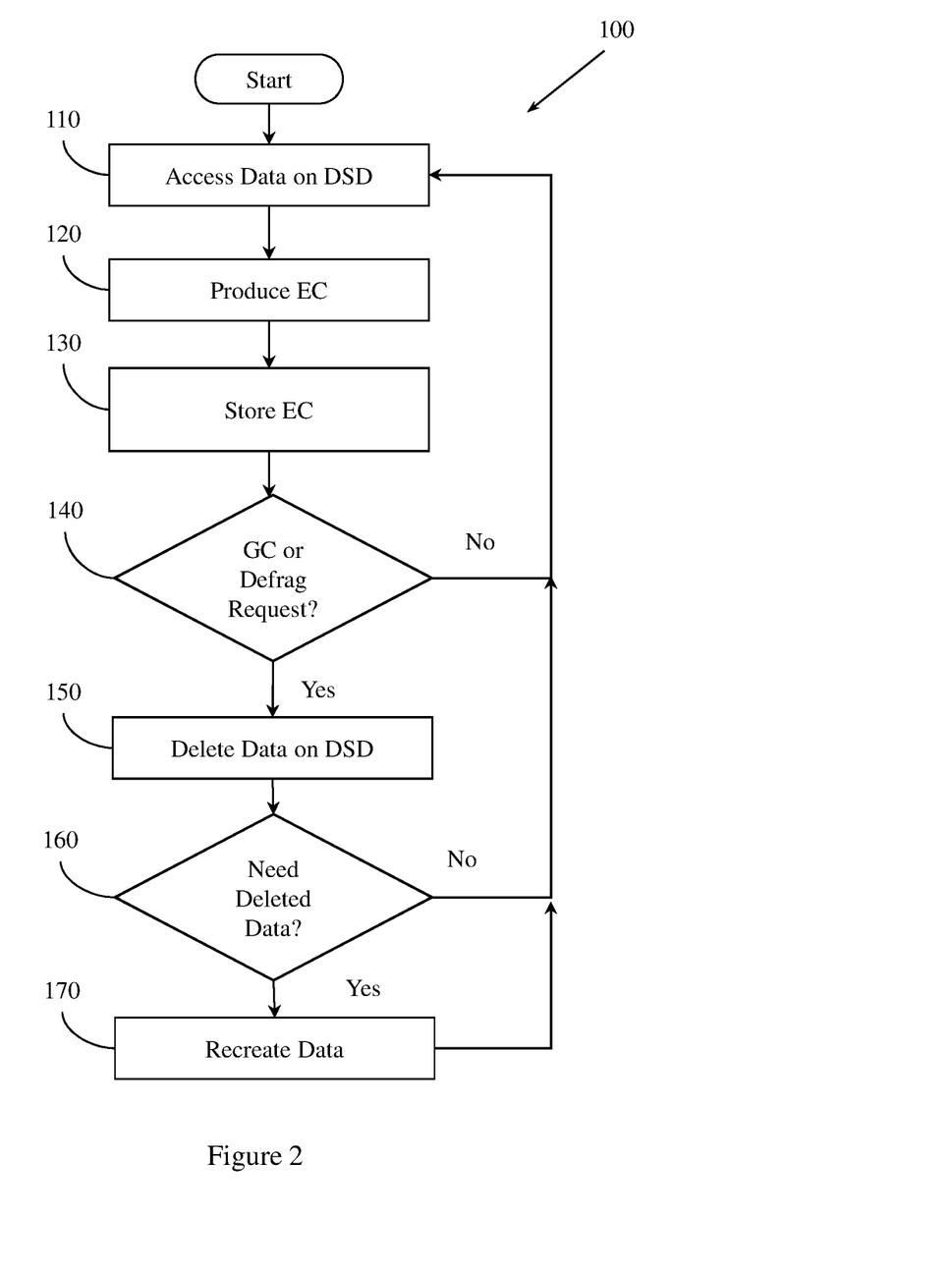
FIG. 2 illustrates an example method associated with improved reclamation, GC or defrag for SSD and SMR drives.

FIG. 2 illustrates another embodiment of method 100. This embodiment also includes, at 160, determining whether data that was deleted as part of the reclamation, GC or defrag is needed. The data may be needed if, for example, a process tries to read from a deleted location. If the data is needed, then method 100 may proceed, at 170, to selectively recreate the portion of the data using the erasure code data. In one embodiment, recreating the portion of the data is performed using a fixed generator matrix that was used to produce the erasure code data. Once the data has been recreated it may be stored in a pre-determined location on the DSD. For example, the recreated data may be stored sequentially and contiguously starting at a pre-defined start location. In one embodiment, data may only be recreated on an as-needed basis. In another embodiment, all the deleted data may be recreated over time when processor cycles are available. In one embodiment, rather than wait for the deleted data to be needed, example apparatus and methods may opportunistically recreate the deleted data. For example, a background process may determine when system resources (e.g., processor, DSD) are inactive and then use available processor cycles to recreate deleted data.

Figure 3:
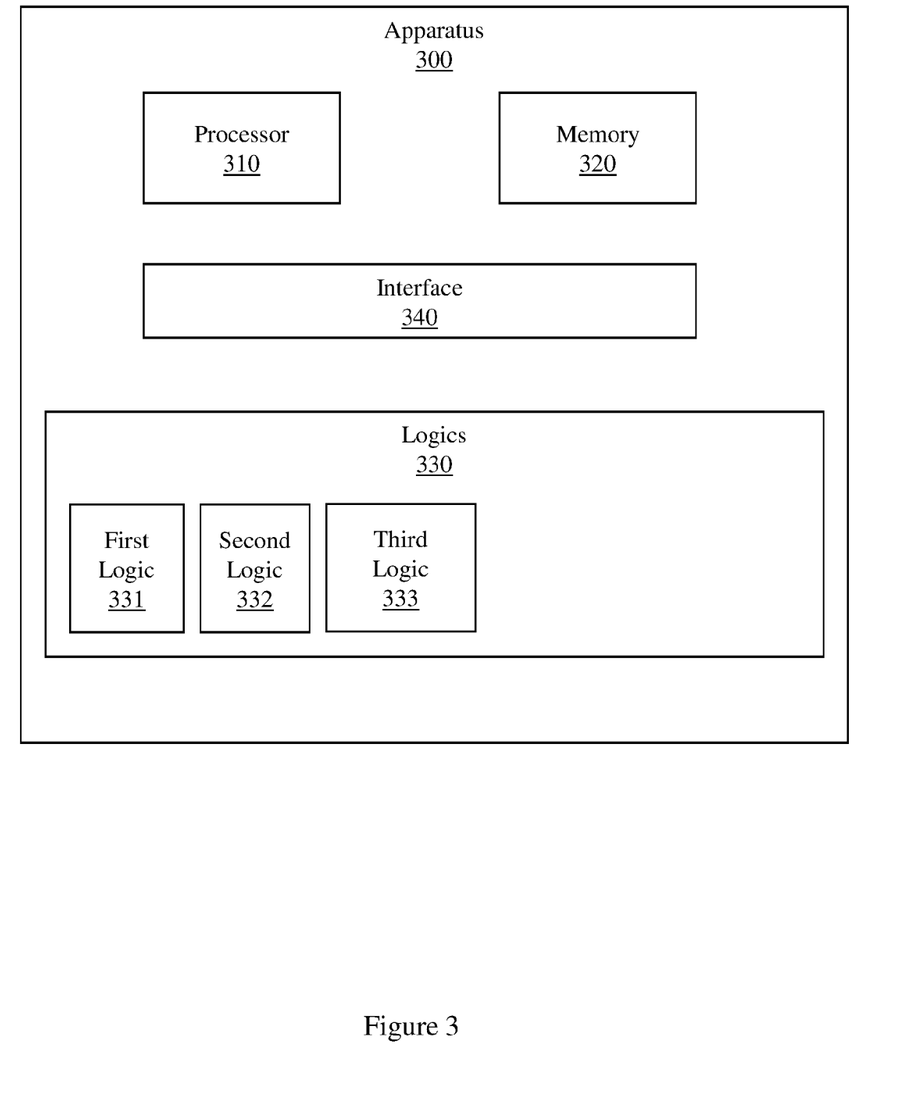
FIG. 3 illustrates an example apparatus for improving GC and defrag for SSD and SMR drives.

FIG. 3 illustrates an example apparatus 300 associated with improving reclamation, GC and def rag for data storage devices including SSD and SMR drives. Apparatus 300 includes a processor 310, a memory 320, and a set 330 of logics that is connected to the processor 310 and memory 320 by an interface 340. In one embodiment, the apparatus 300 may be a stand-alone device connected to a data communication network. In another embodiment, apparatus 300 may be integrated into another device, including a data storage device. In one embodiment, the functionality associated with the set of logics 330 may be performed, at least in part, by hardware logic components including, but not limited to, field-programmable gate arrays (FPGAs), application specific integrated circuits (ASICs), application specific standard products (ASSPs), system on a chip systems (SOCs), or complex programmable logic devices (CPLDs). In one embodiment, individual members of the set of logics 330 are implemented as PLDs, ASICs or SOCs. In one embodiment, the first logic 331, the second logic 332, or the third logic 333 may be ASICs, FPGA, programmable logic devices (PLD)s, or other integrated circuits.

Memory 320 stores data for managing erasure codes for the data storage device (e.g., SSD, SMR) for which apparatus 300 provides improved reclamation, GC or defrag. The data may include the location of erasure codes, the number or type of erasure codes available, information concerning whether the underlying data is intact or has been deleted as part of a reclamation, GC or defrag, or other information.

The set of logics 330 includes a first logic 331 that provides an erasure code layer to protect data on an SSD or SMR drive. The erasure code layer may be provided using Fountain Codes or other types of erasure codes. In one embodiment, the erasure code layer may be updated on the fly as new data is added to the DSD. In another embodiment, the erasure code layer may be updated periodically or according to some schedule. In one embodiment, the erasure code layer may be created or updated on demand in response to the issuance of a GC or defrag command. In one embodiment, the first logic 331 stores information associated with the erasure code layer on a device or devices other than the SSD or SMR drive. For example, rather than store the erasure code layer data on the device that will be subjected to GC or defrag, the erasure code data layer may be stored on another device to facilitate bulk erasing of the device that will be subjected to GC or defrag. When the erasure code data is stored on a separate device, the data may be selectively recreated from the erasure code data even while the bulk erasing of the DSD is in progress. This improves over conventional systems where the DSD is typically completely unavailable during GC or defrag.

The set of logics 330 also includes a second logic 332 that provides a collective delete function for data on the SSD or SMR drive. The collective delete function allows more data to be erased at the same time or in response to fewer commands than conventional systems. Conventional defrag or GC may proceed unit (e.g., block, page, sector, track) by unit. Example apparatus and methods may proceed in larger groupings of units, even up to an entire device. In one embodiment, the second logic 332 deletes data from an SSD N blocks at a time, where a block includes two or more pages, N being a number greater than four. Different numbers of pages and blocks may be employed. In one embodiment, the second logic 332 deletes data from the SMR drive a related set of tracks at a time, or a zone or node at a time. A related set of tracks may be, for example, a set of tracks for which there is some overlap. In different embodiments the deletion may be actual (e.g., zeroes written to the data) or may be logical (e.g., unit of storage listed as unused and available for writing).

In one embodiment, the first logic 331 stores information associated with the erasure code layer in locations on the SSD or SMR drive that are separate from the data on the SSD or SMR drive and that are not subject to the collective delete function provided by the second logic 332. For example, an SMR drive may have an erase head or other element whose sole purpose is to reconfigure (e.g., wipe, overwrite) a large number of tracks of the spinning disk in a few or even one spin of the platter. The sole purpose erase head may be used to wipe, for example, 10% of the tracks on the spinning platter at a time, which is much more efficient than using the read/write head to overwrite tracks one at a time. The first logic 331 may store erasure code layer data or information in a region of the spinning platter that will not appear under the special purpose delete head.

The set of logics 330 also includes a third logic 333 that controls the second logic 332 to selectively delete data from the SSD or SMR drive upon detecting a reclamation, defrag or GC request for the SSD or SMR drive. In one embodiment, deleting data from the SSD or SMR drive removes all copies of the deleted data from the SSD or SMR drive without creating a new copy of the deleted data. Additionally, deleting the data from the SSD or SMR drive removes all copies of the data from the apparatus 300 without creating a new copy of the deleted data. This is more efficient than conventional systems that copy data from disk location to disk location during defrag or GC.

Figure 4:
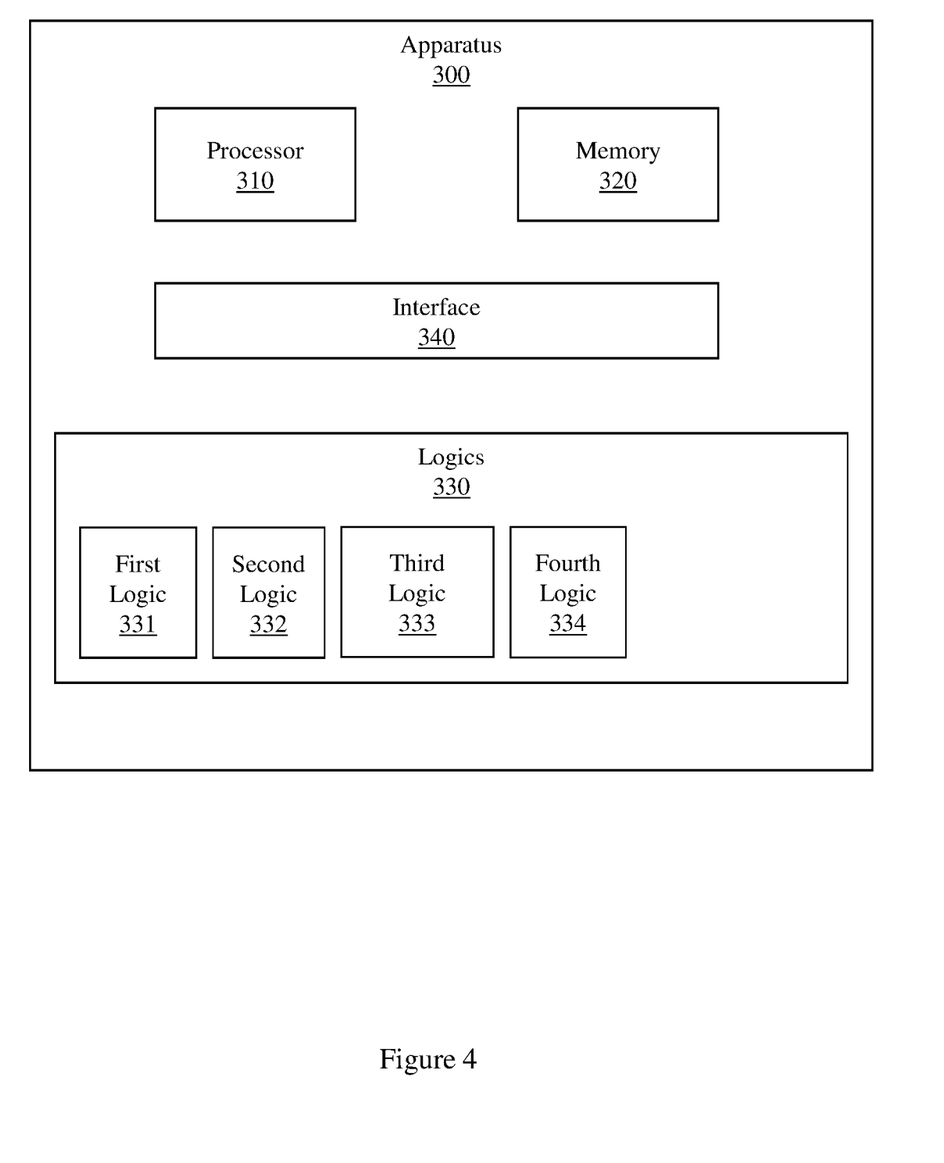
FIG. 4 illustrates an example apparatus for improving GC and defrag for SSD and SMR drives.

FIG. 4 illustrates another embodiment of apparatus 300. In FIG. 4, the set of logics 330 also includes a fourth logic 334 that selectively recreates a portion of the data using information available in the erasure code layer. In one embodiment, the first logic 331 uses a fixed generator matrix to provide the erasure code layer and the fourth logic 334 uses the same fixed generator matrix to recreate the portion of the data from information available in the erasure code layer. In one embodiment, the data may be recreated on-demand as needed. For example, if no-one ever reads a piece of deleted data for which recreation information is available in the erasure code layer, then that piece of deleted data may never be recreated. But if someone does read the piece of deleted data, then it may be recreated after being read. In one example, data may be selectively recreated according to a schedule or plan. The recreating may be done as, for example, a background process that operates when resource usage on apparatus 300 is below a threshold.

Figure 5:
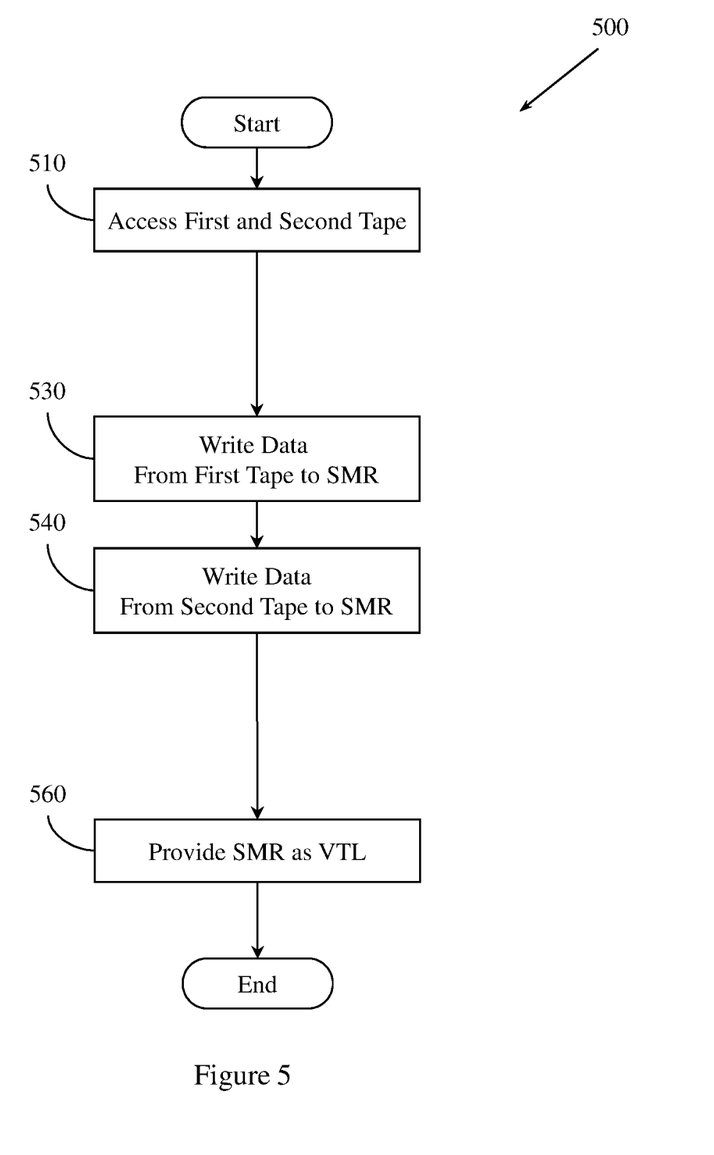
FIG. 5 illustrates an example method associated with using an SMR drive to store tape data.

FIG. 5 illustrates an example method 500 associated with using an SMR drive to store tape data. The tape data may be stored to facilitate, for example, transporting the data from a large number of physical tapes on a single SMR. The tape data may be stored to facilitate, for example, providing a virtual tape library on an SMR.

Method 500 includes, at 510, accessing a first tape and a second tape. Accessing the first tape and the second tape may include establishing data communications or an operable connection with a tape drive or drives or with a tape library or libraries. Accessing the first tape and second tape may include receiving a physical or logical address from which data on the tapes can be read. Accessing the first tape and second tape is a computer-based operation and does not mean, for example, picking a tape up in your hand.

Method 500 also includes, at 530, writing first data from the first tape to a first contiguous set of tracks on an SMR device, or to a zone on the SMR drive. The data from the first tape may be written together to improve storage efficiency on the tape drive. In one embodiment, the first data may be written sequentially in overlapping tracks on the SMR device.

Method 500 also includes, at 540, writing second data from the second tape to a second different contiguous set of tracks on the SMR device or to a second different zone on the SMR device. The second data may also be written sequentially to a different set of overlapping tracks on the SMR device.

Writing the data from a tape to a related set of overlapping tracks or to a zone on the SMR may facilitate virtualizing the tape on the SMR and addressing the data collectively rather than individually. Writing the data from different tapes in different individually addressable collections of overlapping tracks or zones on the SMR device may facilitate using the SMR device as a virtual tape library (VTL) or tape library transport device.

Thus, method 500 also includes, at 560, providing the SMR device as a collective virtual tape library that virtualizes the first tape and the second tape. While a first tape and a second tape are described, a greater number of tapes may be written to the SMR device. Virtualizing a tape on an SMR drive means that the data on the SMR drive may be accessed as though the data was on a tape.

Figure 6:
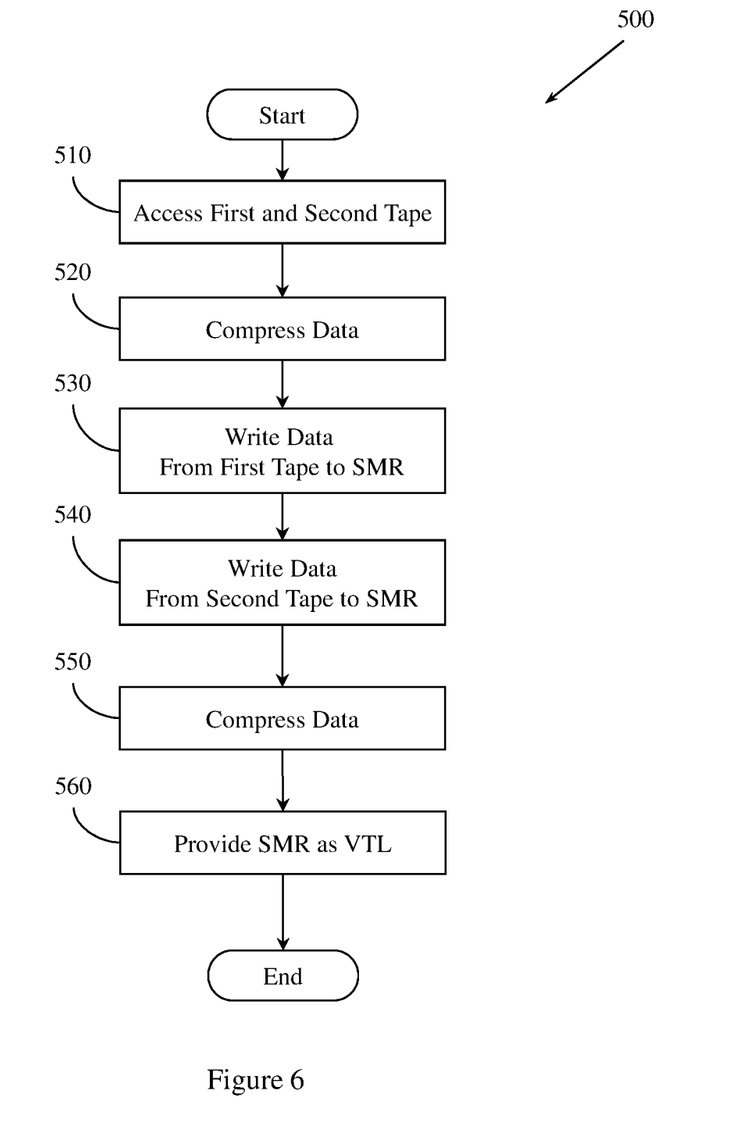
FIG. 6 illustrates an example method associated with using an SMR drive to store tape data.

FIG. 6 illustrates another embodiment of method 500. This embodiment of method 500 includes, at 520, compressing the first data before writing the first data from the first tape to the SMR device and compressing the second data from the second tape before writing the second data from the second tape to the SMR device. Compressing the data before it is written may facilitate using less space on the SMR. The compression may take different forms including, for example, single instancing, data deduplication, Lempel-Ziv (LZ) compression, or other forms of compression.

This embodiment of method 500 also includes, at 550, compressing the first data on the SMR device after writing the first data to the SMR device and compressing the second data on the SMR device after writing the second data to the SMR device. In one embodiment, either action 520 or action 550 may be taken. In another embodiment, both actions 520 and 550 may be taken. A decision concerning whether to perform compression at 520 or at 550 may be made based, at least in part, on the data reduction possible by the different types of compression. The decision concerning whether to perform compression at 520 or 550 may, additionally or alternatively, be based, at least in part, on the computing resources (e.g., processor cycles, memory) or energy required to perform the compression.

Figure 7:
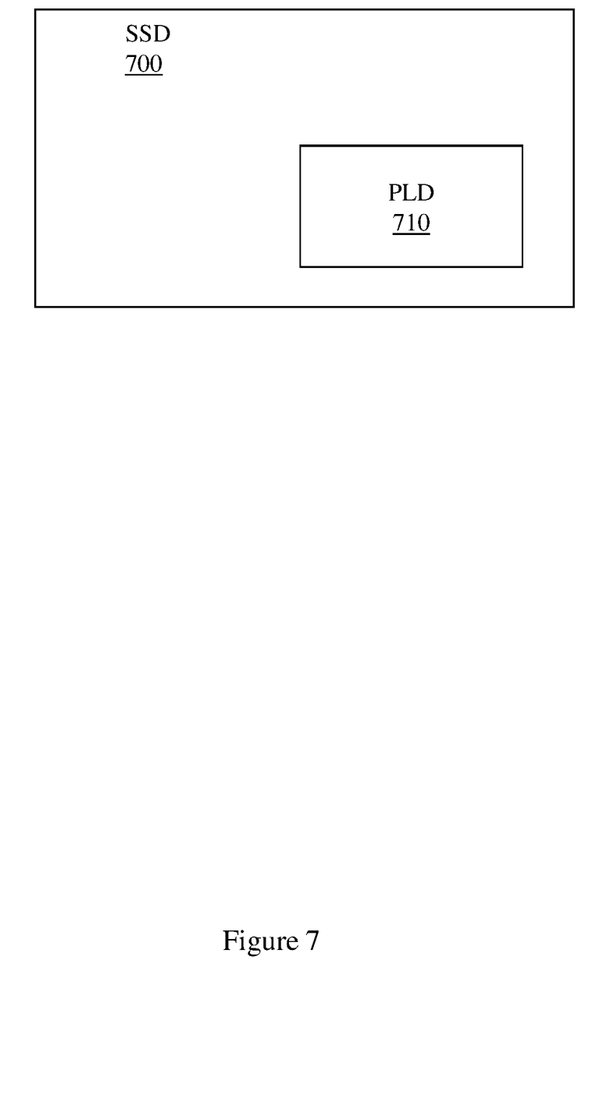
FIG. 7 illustrates an example SSD and PLD.

FIG. 7 illustrates an example SSD 700 and PLD 710. PLD 710 controls defragmentation or garbage collection on an SSD. The PLD 710 includes gates that are configured to provide erasure code protection for data stored on the SSD. The PLD 710 also includes gates configured to provide single-instruction ubiquitous erasure of all non-erasure code data on the SSD in response to a garbage collection or defragmentation request for the SSD. Thus, PLD 710 may be programmed to perform method 100. SSD 700 will perform GC and defrag more efficiently than a conventional SSD because of the reduced number of operations performed due to the special purpose integrated circuit 710.

Figure 8:
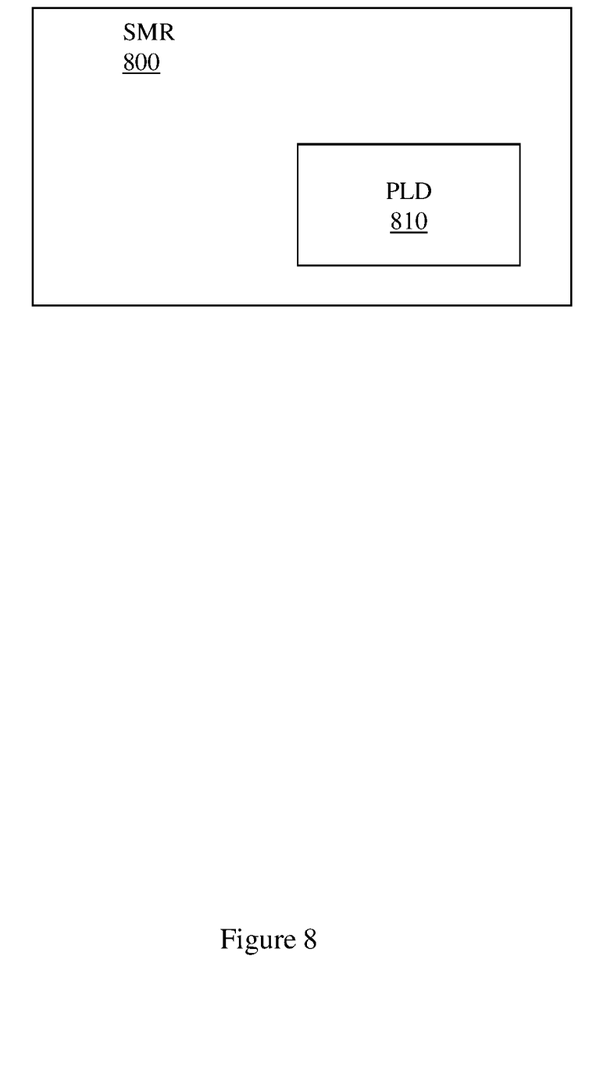
FIG. 8 illustrates an example SMR drive and PLD.

FIG. 8 illustrates an example SMR drive 800 and PLD 810. PLD 810 controls defragmentation or garbage collection on an SMR drive. The PLD 810 includes gates configured to provide erasure code protection for data stored on the SMR drive. PLD 810 also includes gates configured to provide single-instruction ubiquitous erasure of all non-erasure code data on the SMR drive in response to a garbage collection or defragmentation request for the SMR drive. Thus, PLD 810 may be programmed to perform method 100. SMR drive 800 will perform GC and defrag more efficiently than a conventional SSD because of the reduced number of operations performed due to the special purpose programmable logic device 810.

In one embodiment, PLD 810 controls creation of a virtual tape library on SMR drive 800. In this embodiment, PLD 810 includes gates configured to identify data associated with two or more physical tapes and to write data from individual members of the two or more physical tapes in sets of contiguous or overlapping tracks on the SMR drive 800. In another embodiment, PLD 810 facilitates presenting an SMR drive as a VTL. In this embodiment, PLD 810 includes gates configured to receive data from a tape or VTL process or software and to cause the data to be written like a tape onto SMR drive 800.

Figure 9:
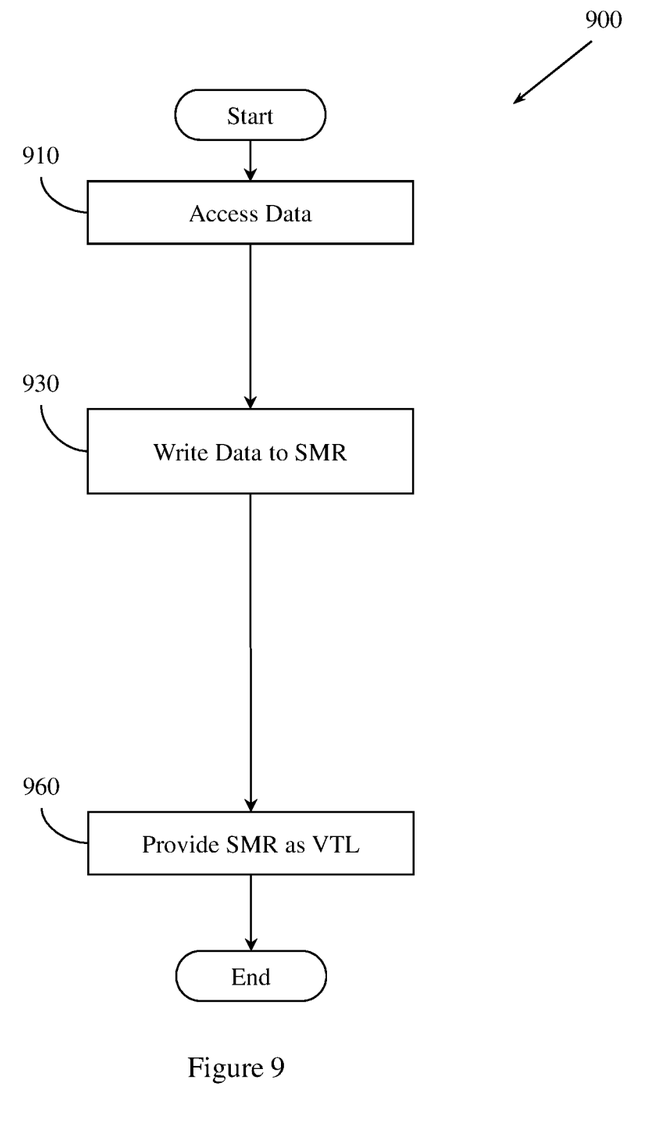
FIG. 9 illustrates an example method associated with using an SMR drive to store tape data.

FIG. 9 illustrates an example method 900 associated with using an SMR drive as a virtual tape library. Method 900 includes, at 910, accessing a data to be stored on an SMR. Accessing the data may include establishing data communications or an operable connection with a data provider or data storage device. Accessing the data may include receiving a physical or logical address from which data can be read. Accessing the data is a computer-based operation and does not mean, for example, looking at the data on a piece of paper.

Method 900 also includes, at 930, writing the data to a first contiguous set of tracks on an SMR device, or to a zone on the SMR drive. The data may be written together to improve storage efficiency on the SMR drive. In one embodiment, the first data may be written sequentially in overlapping tracks on the SMR device. When the data is written sequentially in overlapping tracks on a single zone on the SMR device then the data may be treated as a virtual tape.

Writing the data to a related set of overlapping tracks or to a zone on the SMR may facilitate virtualizing the tape on the SMR and addressing the data collectively rather than individually. Writing the data in different individually addressable collections of overlapping tracks or zones on the SMR device may facilitate using the SMR device as a virtual tape library (VTL) or tape library transport device.

Thus, method 900 also includes, at 960, providing the SMR device as a collective virtual tape library that virtualizes the data as one or more virtual tapes. Virtualizing a tape on an SMR drive means that the data on the SMR drive may be accessed as though the data was on a tape. Thus, conventional VTL or tape software or processes may interact with the data on the SMR as though the data was on a tape or in a VTL.

Figure 10:
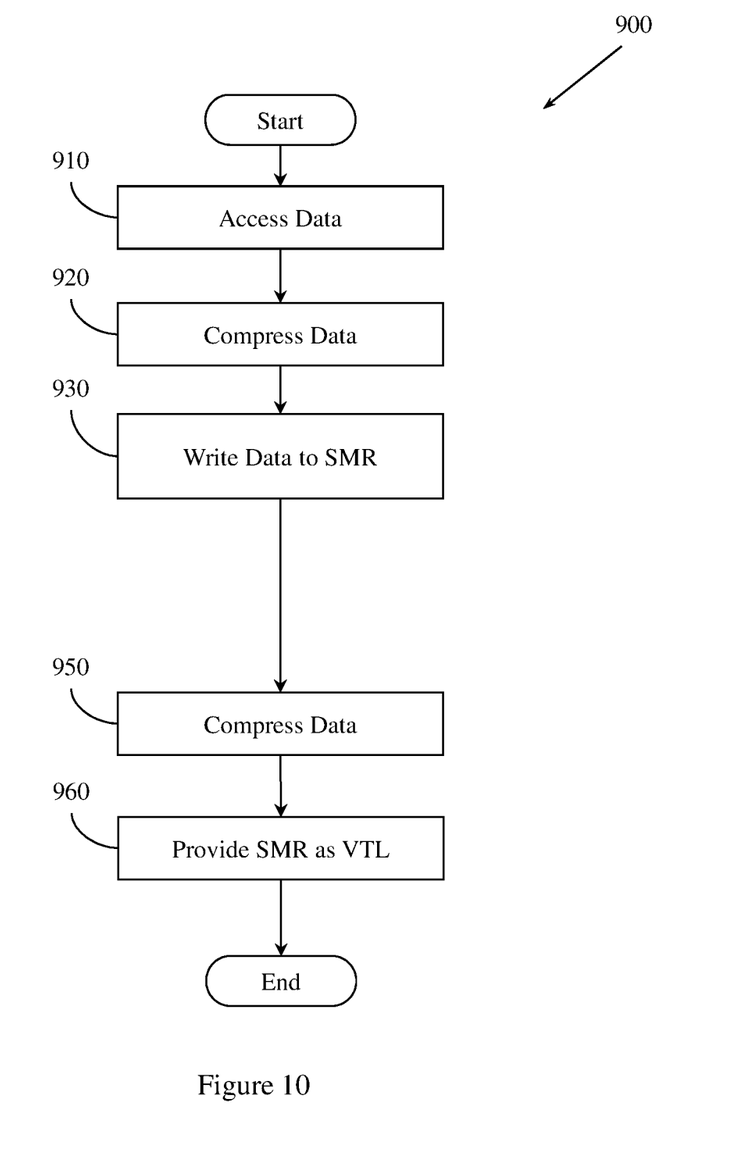
FIG. 10 illustrates an example method associated with using an SMR drive to store tape data.

FIG. 10 illustrates another embodiment of method 900. This embodiment of method 900 includes, at 920, compressing the data before writing the data to the SMR device. Compressing the data before it is written may facilitate using less space on the SMR. The compression may take different forms including, for example, single instancing, data deduplication, Lempel-Ziv (LZ) compression, or other forms of compression.

This embodiment of method 900 also includes, at 950, compressing the data on the SMR device after writing the data to the SMR device. In one embodiment, either action 920 or action 950 may be taken. In another embodiment, both actions 920 and 950 may be taken. A decision concerning whether to perform compression at 920 or at 950 may be made based, at least in part, on the data reduction possible by the different types of compression. The decision concerning whether to perform compression at 920 or 950 may, additionally or alternatively, be based, at least in part, on the computing resources (e.g., processor cycles, memory) or energy required to perform the compression.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and other similar terms, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer-readable storage medium", as used herein, refers to a non-transitory medium that stores instructions and/or data. "Computer-readable storage medium" does not refer to propagated signals. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a data structure (e.g. a list, a queue, a heap, a tree) a memory, a register, or other repository. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include, for example, a software controlled microprocessor, a programmable logic device (PLD), a discrete logic (e.g., ASIC), an analog circuit, a digital circuit, a programmed logic device, a system on a chip (SoC) or a memory device containing instructions. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Object", as used herein, refers to the usage of object in computer science. From one point of view, an object may be considered to be a location in a physical memory having a value and referenced by an identifier.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, or a bit stream, that can be received, transmitted and/or detected.

"Software", as used herein, includes but is not limited to, one or more executable instructions that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, or programs including separate applications or code from dynamically linked libraries.

"User", as used herein, includes but is not limited to one or more persons, software, logics, applications, computers or other devices, or combinations of these.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

What is claimed is:

1. A non-transitory computer-readable storage medium storing computer executable instructions that when executed by a computer control the computer to perform a method, the method comprising:

accessing a first tape and a second tape;

upon determining that a data reduction level achieved by compressing first data from the first tape before writing the first data from the first tape to a shingled magnetic recording (SMR) device and compressing second data from the second tape before writing the second data from the second tape to the SMR device exceeds a data reduction level achieved by compressing the first data on the SMR device after writing the first data to the SMR device and compressing the second data on the SMR device after writing the second data to the SMR device:

compressing the first data before writing the first data from the first tape to the SMR device and compressing the second data from the second tape before writing the second data from the second tape to the SMR device;

writing the first data from the first tape to a first contiguous set of overlapping tracks on the SMR device;

writing the second data from the second tape to a second different contiguous set of overlapping tracks on the SMR device;

upon determining that a data reduction level achieved by compressing the first data after writing the first data from the first tape to the SMR device and compressing the second data from the second tape after writing the second data from the second tape to the SMR device exceeds a data reduction level achieved by compressing the first data on the SMR device before writing the first data to the SMR device and compressing the second data on the SMR device before writing the second data to the SMR device:

compressing the first data after writing the first data from the first tape to the SMR device and compressing the second data from the second tape after writing the second data from the second tape to the SMR device; and providing the SMR device as a collective virtual tape library that virtualizes the first tape and the second tape.

2. The non-transitory computer-readable storage medium of claim 1, the method comprising:

compressing the first data before writing the first data from the first tape to the SMR device and compressing the second data from the second tape before writing the second data from the second tape to the SMR device; and compressing the first data on the SMR device after writing the first data to the SMR device and compressing the second data on the SMR device after writing the second data to the SMR device.

3. The non-transitory computer-readable storage medium of claim 1, where compressing the first data or compressing the second data includes compressing the first data or the second data using a single instancing approach, a data deduplication approach, or a Lempel-Ziv (LZ) compression approach.

4. The non-transitory computer-readable storage medium of claim 1, where writing first data from the first tape to the first contiguous set of overlapping tracks includes writing the first data sequentially.

5. The non-transitory computer-readable storage medium of claim 1, where writing second data from the second tape to the second different contiguous set of overlapping tracks includes writing the second data sequentially.

6. The non-transitory computer-readable storage medium of claim 1, where the collective virtual tape library addresses the first data or the second data collectively.

7. A non-transitory computer-readable storage medium storing computer executable instructions that when executed by a computer control the computer to perform a method, the method comprising:

accessing data to be stored by a process that writes to a tape drive or to a virtual tape library, where compressing the data before writing the data to a shingled magnetic recording (SMR) device has a first data reduction level, a first computing resource cost, or a first energy requirement, and where compressing the data on the SMR device after writing the data to the SMR device has a second data reduction level, a second computing resource cost, or a second energy requirement;

upon determining that the first data reduction level is greater than the second data reduction level:

compressing the data before writing the data to the SMR device;

writing the data to a first contiguous set of overlapping tracks on the SMR device;

upon determining that the second data reduction level is greater than the first data reduction level:

compressing the data on the SMR device after writing the data to the SMR device; and providing the SMR device as a virtual tape library that virtualizes the data as a virtual tape.

8. The non-transitory computer-readable storage medium of claim 7, where compressing the data before writing the data includes compressing the data using a single instancing approach, a data deduplication approach, or a Lempel-Ziv (LZ) compression approach.

9. The non-transitory computer-readable storage medium of claim 7, where compressing the data on the SMR device after writing the data includes compressing the data using a single instancing approach, a data deduplication approach, or a Lempel-Ziv (LZ) compression approach.

10. The non-transitory computer-readable storage medium of claim 7, the method comprising:
computing a first cost based on the first computing resource cost and the first energy requirement;
computing a second cost based on the second computing resource cost and the second energy requirement;
upon determining that the first cost is greater than the second cost:
compressing the data on the SMR device after writing the data to the SMR device;
upon determining that the second cost is greater than the first cost:
compressing the data before writing the data to the SMR device.

11. An apparatus, comprising:
a shingled magnetic recording (SMR) drive;
a memory;
a processor;
an input/output (I/O) interface;
a set of circuits comprising a data access circuit, a data reduction level circuit, a compression circuit, a storage circuit, and a virtual tape library (VTL) circuit; and
an interface that connects the memory, the processor, the I/O interface, the SMR drive, and the set of circuits;
where the data access circuit is configured to access data to be stored by a process that writes to a tape drive or to a virtual tape library;
where the data reduction level circuit is configured to:
compute a first data reduction value associated with compressing the data before writing the data to the SMR drive;
compute a second data reduction value associated with compressing the data after writing the data to the SMR drive;
where the compression circuit is configured to:
upon determining that the first data reduction value is greater than the second data reduction value:
compress the data before writing the data to the SMR drive;
upon determining that the second data reduction value is greater than the first data reduction value:
compress the data after writing the data to the SMR drive;
where the storage circuit is configured to write the data to a first contiguous set of overlapping tracks on the SMR drive; and
where the VTL circuit is configured to provide the SMR drive as a collective VTL that virtualizes the data as a virtual tape.

12. The apparatus of claim 11, where the data reduction level circuit is configured to compute the first data reduction value based, at least in part on a first data reduction level, a first computing resource cost, or a first energy requirement associated with compressing the data before writing the data to the SMR drive, and
where the data reduction level circuit is configured to compute the second data reduction value based, at least in part, on a second data reduction level, a second computing resource cost, or a second energy requirement associated with compressing the data after writing the data to the SMR drive.

13. The apparatus of claim 11, where the storage circuit is configured to write the data sequentially to a first contiguous set of overlapping tracks on the SMR drive.

* * * * *